(12) United States Patent
Singh et al.

(10) Patent No.: US 7,562,108 B2
(45) Date of Patent: Jul. 14, 2009

(54) HIGH BANDWIDTH HIGH GAIN RECEIVER EQUALIZER

(75) Inventors: Bhajan Singh, Birmingham (GB); Andrew Pickering, Rugby (GB); Richard Ward, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 778 days.

(21) Appl. No.: 11/151,573

(22) Filed: Jun. 13, 2005

(65) Prior Publication Data

US 2006/0001504 A1 Jan. 5, 2006

(30) Foreign Application Priority Data

Jun. 14, 2004 (GB) .................. 0413112.4

(51) Int. Cl.
*G06G 7/02* (2006.01)
(52) U.S. Cl. ..................................... 708/819
(58) Field of Classification Search .................. 708/819
See application file for complete search history.

(56) References Cited

U.S. PATENT DOCUMENTS

| | | | |
|---|---|---|---|
| 3,204,048 A | 8/1965 | De Monte | .................. 179/170 |
| 3,794,935 A | 2/1974 | Tsuchiya et al. | .......... 333/28 R |
| 4,063,187 A * | 12/1977 | Orchard | ...................... 330/107 |
| 4,112,262 A * | 9/1978 | Stiefel | ......................... 379/344 |
| 4,423,391 A * | 12/1983 | Ebenhoeh | ................. 333/28 R |
| 5,103,190 A * | 4/1992 | Noro | .......................... 330/298 |
| 5,280,543 A * | 1/1994 | Yokoyama et al. | ............ 381/96 |
| 5,428,834 A * | 6/1995 | Dickerson | .................. 455/304 |
| 6,944,066 B1 * | 9/2005 | Jing | ...................... 365/189.05 |

FOREIGN PATENT DOCUMENTS

| | | |
|---|---|---|
| GB | 2 351 423 A | 12/2000 |
| JP | 06342561 A * | 12/1994 |

* cited by examiner

*Primary Examiner*—Tan V Mai
(74) *Attorney, Agent, or Firm*—William B. Kempler; W. James Brady; Frederick J. Telecky, Jr.

(57) ABSTRACT

A receiver equalizer with a first equalizer unit having a basic equalizer stage and a negative impedance cell connected to the basic equalizer stage. Preferably the negative impedance cell has a pair of back to back transistors, and connected thereto a parallel resistor capacitor RC network. The basic equalizer stage has a pair of current sources; a pair of transistors arranged as a differential pair, each transistor connected to a different one of the current sources; and a degeneration impedance connected in between the two current sources, and the transistors, wherein the negative impedance cell is connected across the outputs of the pair of transistors.

8 Claims, 4 Drawing Sheets

HIGH BANDWIDTH HIGH GAIN RECEIVER EQUALIZER

FIELD OF THE INVENTION

The present invention relates to receiver circuits, and more particularly, to a high bandwidth high gain receiver equalizer and a method of applying equalization at the receiver.

BACKGROUND OF THE INVENTION

FIG. 1 illustrates a typical transmitter/receiver channel link 2 in a communications system. The transmitted signal is band-limited by the channel 3, package traces 4, 5 and the load capacitances at the transmitter output 6, and the receiver input 7. Band-limiting produces a severe amount of inter-symbol interference (ISI), resulting in increased bit-error-rate (BER). The higher the data rate is, the higher the degradation of the signal. However, applying equalization at the receiver reduces ISI and improves the BER. Conventional equalizers do not have a high enough bandwidth and gain that is required for today's applications. Thus there is a need for an improved receiver equalizer.

The present invention aims to mitigate at least one of these needs.

SUMMARY OF THE INVENTION

Accordingly there is provided a high bandwidth, high gain receiver equalizer comprising at least one basic equalizers stage connected to a negative impedance cell. According to a preferred embodiment, the receiver equalizers comprises a pair of cascaded basic equalizers stages connected to a negative impedance cell.

Specific embodiments of the invention will now be described, by way of example only, with reference to the accompanying drawings, in which:

DETAILED DESCRIPTION

Figure 1:
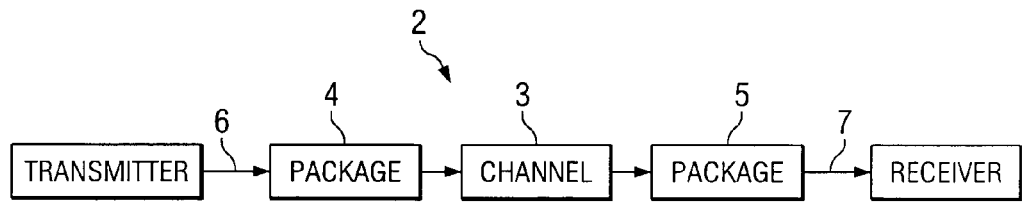
FIG. 1 is a schematic block diagram showing a typical Tx/Rx Channel link.
Figure 2:
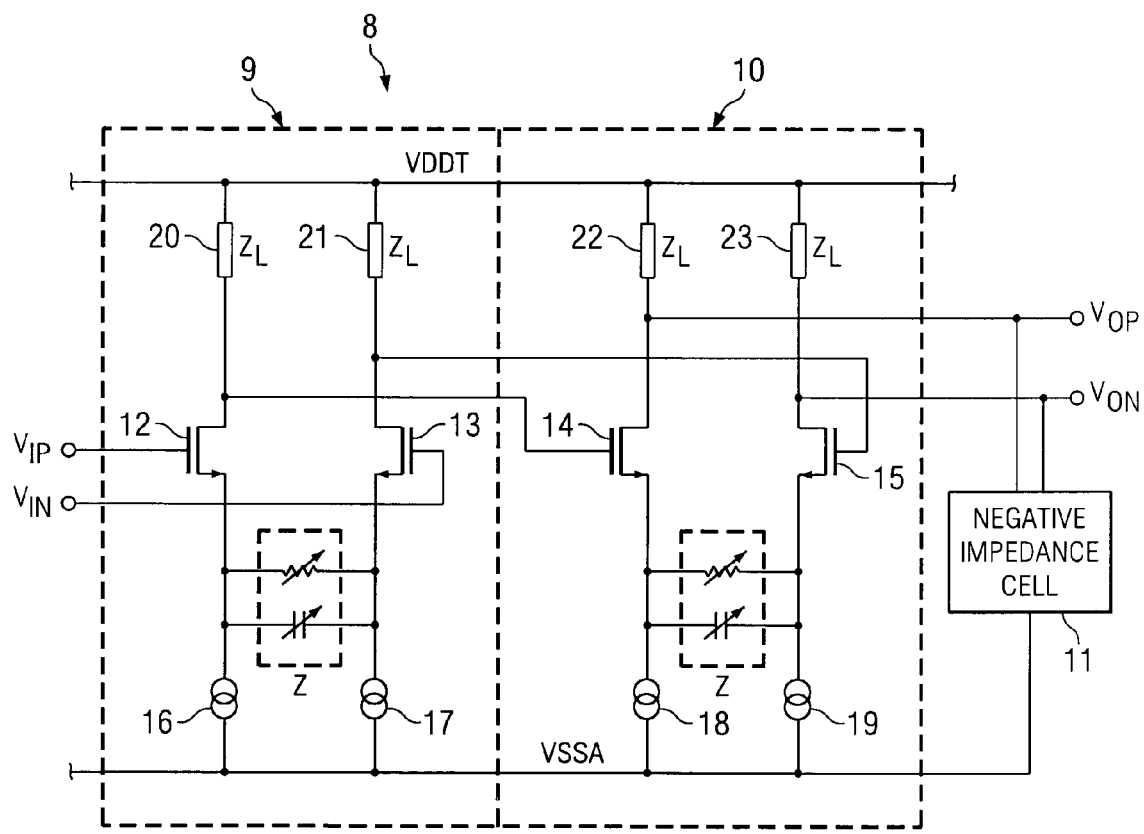
FIG. 2 is a simplified schematic diagram of a receiver equalizers according to a preferred embodiment of the present invention.

With reference to FIG. 2, a preferred embodiment of a receiver equalizer 8 is shown, and which comprises a pair of cascaded basic equalizer stages 9, 10 and a negative imped- ance cell 11 connected across the second of the equalizer stages 10. Each equalizer stage 9, 10 comprises two NMOS transistors 12, 13, 14, 15 arranged as a differential pair. Each transistor 12, 13, 14, 15 is connected to a current source 16, 17, 18, 19. Each equalizer stage 9, 10 has a degeneration impedance Z comprising a parallel RC circuit which connects the current sources 16, 17, 18, 19 of the differential pair of transistors 12, 13, 14, 15. Each of the equalizer stages 9, 10 also includes load impedances $Z_L$ 20, 21, 22, 23 connected between the transistors 12, 13, 14, 15 and the VDDT rail. The transistors 12, 13 of the first equalizer stage 9 have respective inputs $V_{IP}$ and $V_{IN}$. The output of transistor 12 is connected to the input of transistor 14 of the second equalizer stage 10, and the output of transistor 13 is connected to the input of transistor 15. The two basic equalizer stages are used in a cascaded arrangement in order to realise higher gain. The negative impedance cell is connected across the second equalizer stage 10. The negative impedance cell is used to extend bandwidth and achieve gain-peaking characteristics at high frequency.

Although the two equalizer stages 9, 10 in FIG. 2 are shown as being identical, they may comprise differing arrangements as would be well know to the skilled person. The Impedances $Z_L$ may be identical or have different values.

Figure 3:
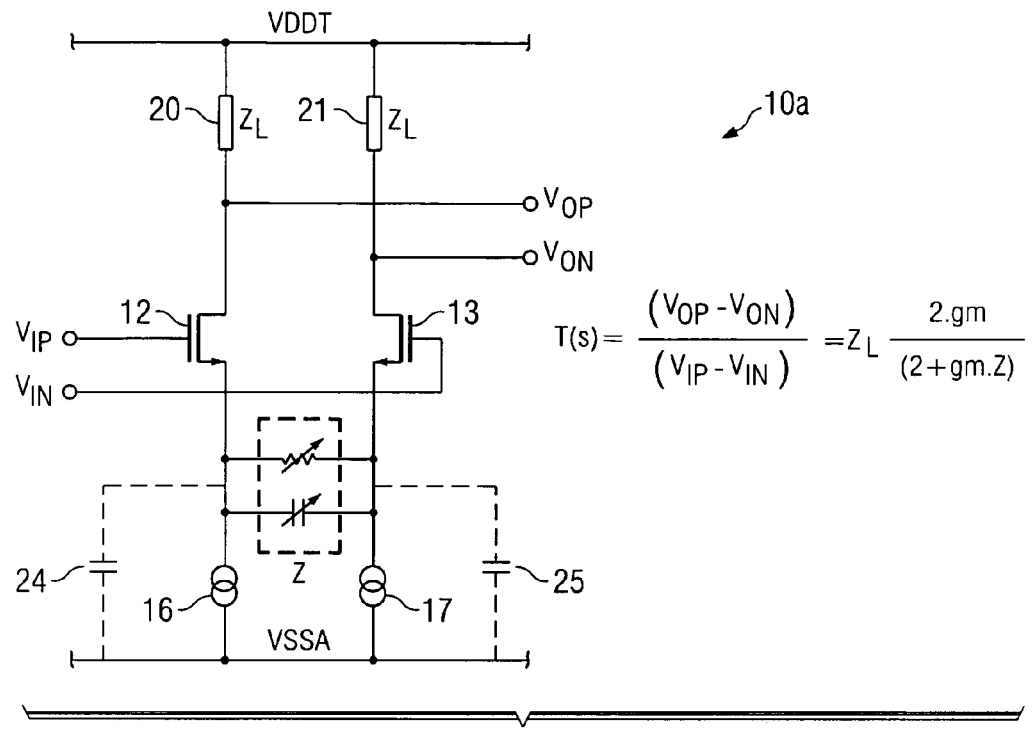
FIG. 3 is a schematic diagram of a basic equalizers stage (without a negative impedance cell) that makes up part of the FIG. 2 embodiment.

Instead of the degeneration impedance Z arrangement shown in FIG. 2 for the equalization stages 9, 10, an alternative arrangement for impedance Z may be used where the capacitor C may be replaced by two capacitors 24, 25 each one being connected in parallel to a current source 16, 17 as shown in FIG. 3.

Figure 4:
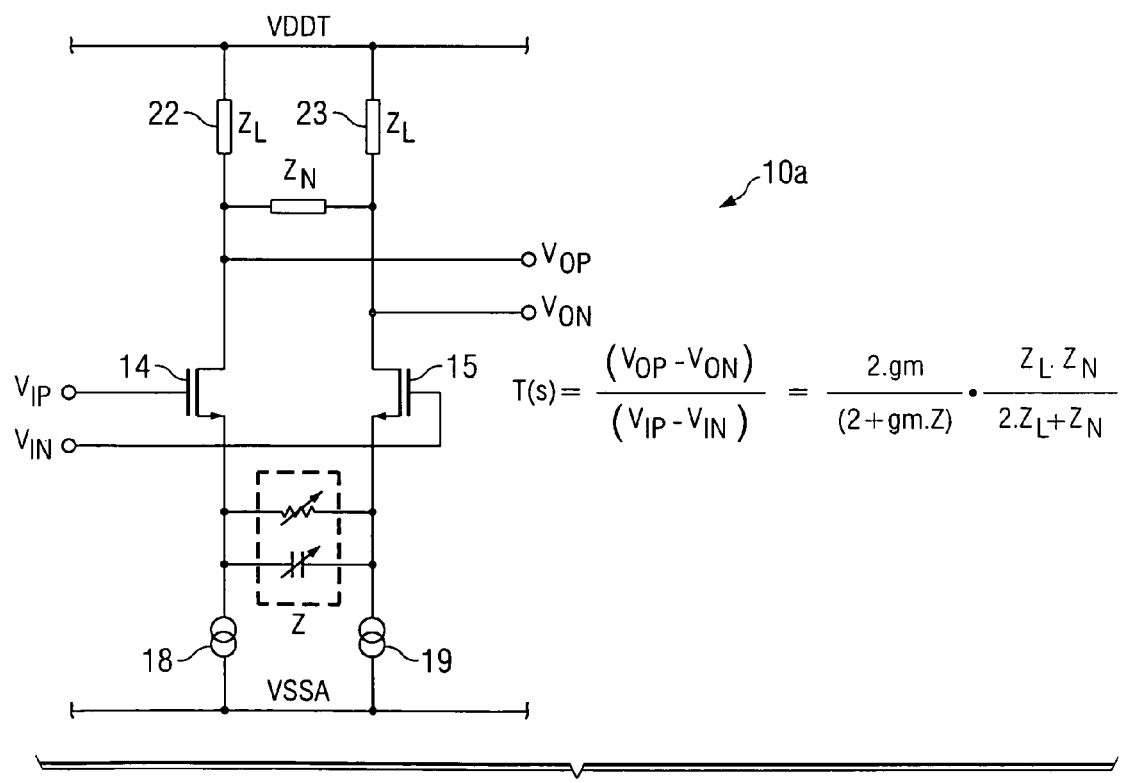
FIG. 4 is a schematic diagram of a basic equalizer stage with a negative impedance cell that makes up part of the FIG. 2 embodiment.

FIG. 3 shows a schematic diagram of one of the basic equalizer stages 10a of FIG. 2 but without having a negative impedance cell connected across it. The transfer function for the input to output of the equalizer stage can be expressed as:

$$T(s) = \frac{(V_{OP} - V_{ON})}{(V_{IP} - V_{IN})} = Z_L \cdot \frac{2 \cdot gm}{(2 + gm \cdot Z)} \quad (1)$$

where gm is transconductance of input differential pair. With $Z_L$ incorporating a resistance and effective load capacitance, and Z a resistance and parallel parasitic capacitance, the transfer function T(s) comprises one zero and two real poles. Z is the degeneration impedance of the differential pair of transistors FIG. 4 shows a schematic diagram of a basic equalizer stage 10a with a negative impedance cell 11. The circuit is similar to that of FIG. 3, except for an impedance $Z_N$ which is the effective band-limited impedance of the negative impedance cell 11. The transfer function of the equalizer stage with negative impedance cell can be expressed as:

$$T(s) = \frac{(V_{OP} - V_{ON})}{(V_{IP} - V_{IN})} = \frac{2 \cdot gm}{(2 + gm \cdot Z)} \cdot \frac{Z_L \cdot Z_N}{2 \cdot Z_L + Z_N} \quad (2)$$

where gm is the transconcutance of input differential pair. With $Z_L$ and $Z_N$ being parallel RC networks and $Z_N$ being $2^{nd}$ order, the transfer function T(s) comprises one zero, two real poles and one complex pole. Additional high frequency gain-peaking can be achieved by appropriately positioning the complex pole pair.

Figure 5A:
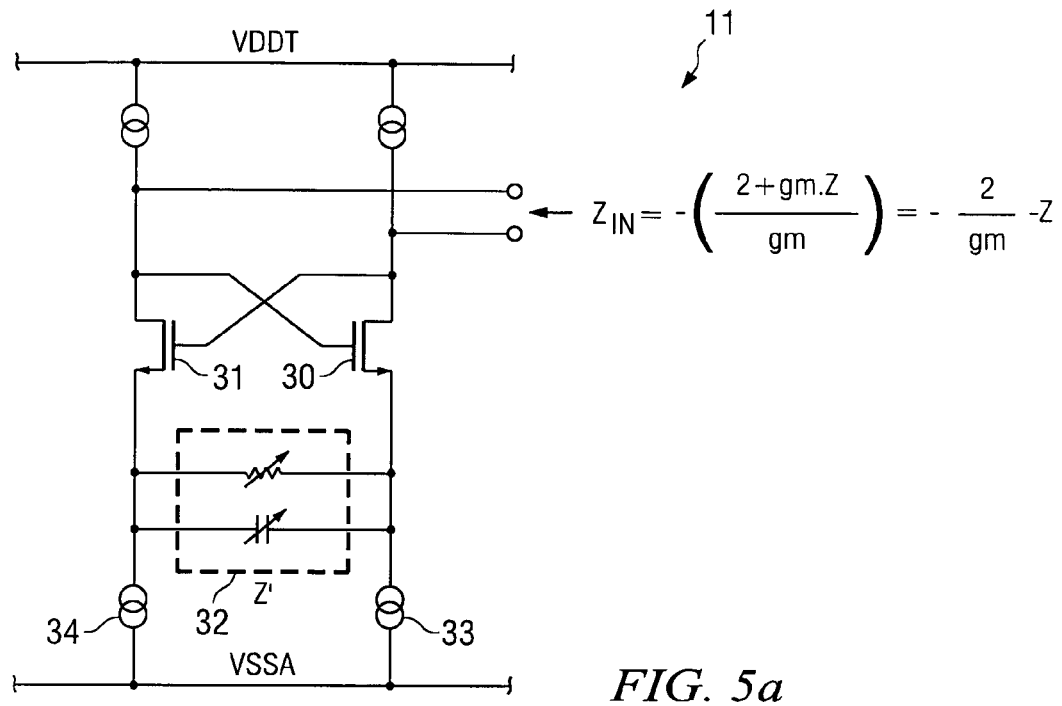
FIG. 5a is a simplified diagram of a negative impedance cell in accordance with the present invention.
Figure 5B:
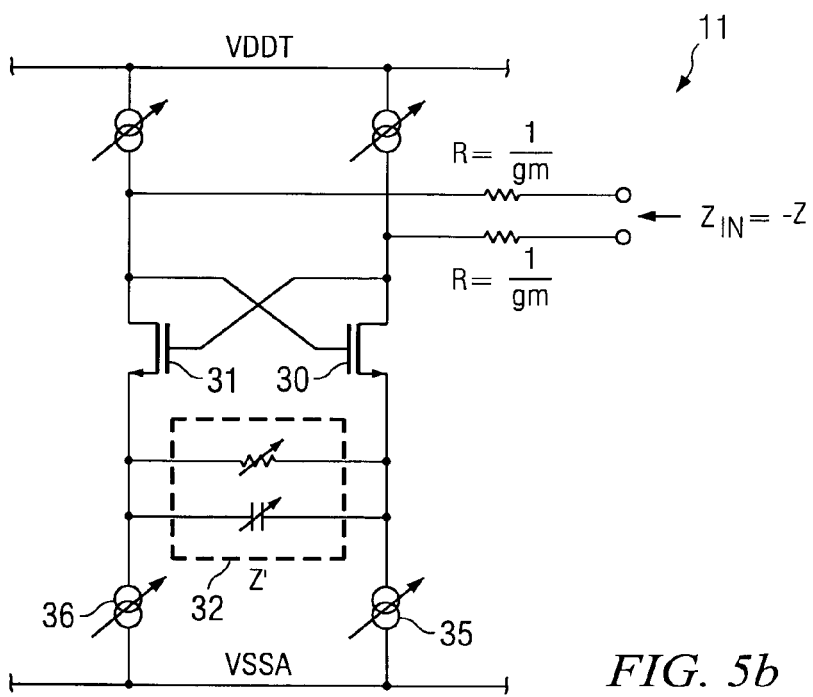
FIG. 5b is a simplified diagram of a modified negative impedance cell in accordance with the present invention.

FIG. 5a shows a simplified diagram of a negative impedance cell 11 which comprises two back-to-back transistors 30, 31. The impedance of the cell can be expressed as:

$$Z_{IN} = -\left(\frac{2+gm\cdot Z}{gm}\right) = -\frac{2}{gm} - Z \quad (3)$$

where gm is the transconductance of the cross-coupled devices. The term $$"-\frac{2}{gm}"$$

in $Z_{IN}$ is undesirable as it degrades the "Q-factor" of the impedance Z and reduces its effectiveness. Therefore it is desirable to remove the parasitic impedance $$"-\frac{2}{gm}"$$

by adding resistance, as is illustrated in FIG. 5b which shows a modified version of a negative impedance cell. The values of resistance R and gm need to be matched to ensure that the Q-factor of impedance Z remains high. This is done by trimming the bias current so that gm tracks the value of resistance R across process corners.

Instead of having capacitor 32 as shown in FIGS. 5a and 5b being connected between the current sources 33, 34 and 35, 36 respectively, the capacitor 32 can be replaced with two capacitors, each connected in parallel with one of the current sources 33, 34 and 35, 36 respectively.

Figure 6A:
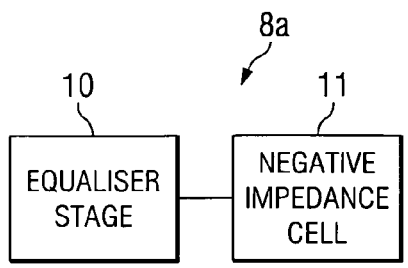
FIGS. 6a and 6b are schematic block diagrams of alternative embodiments of the receiver equalizer in accordance with the present invention.
Figure 6B:
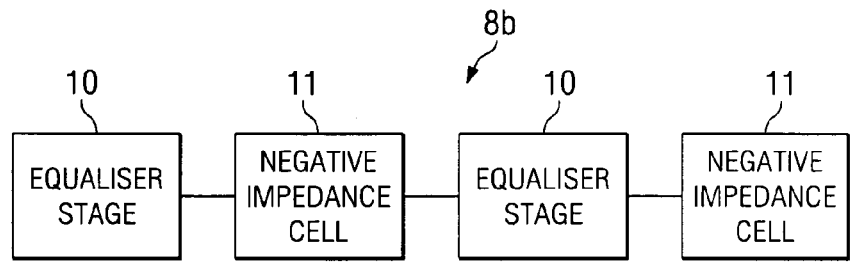

FIGS. 6a, and 6b show alternative arrangements of basic equalizer stage(s) and negative impedance cell(s) that may comprise a receiver equalizer of the present invention. FIG. 6a shows a receiver equalizer 8a comprising one basic equalizer stage 10 with a negative impedance cell 11. FIG. 6b shows an optimum receiver equalizer 8b comprising a first basic equalizer stage 10 with a negative impedance cell 11 cascaded, with a second basic equalizer stage 10 with a second negative impedance cell 11. However, it should be noted that there is a power penalty for each negative impedance cell used in the receiver equalizer. Although the two equalizer and negative impedance stages shown in FIG. 6b are depicted as being identical stages, they may be different stages comprising differing arrangements.

Figure 7:
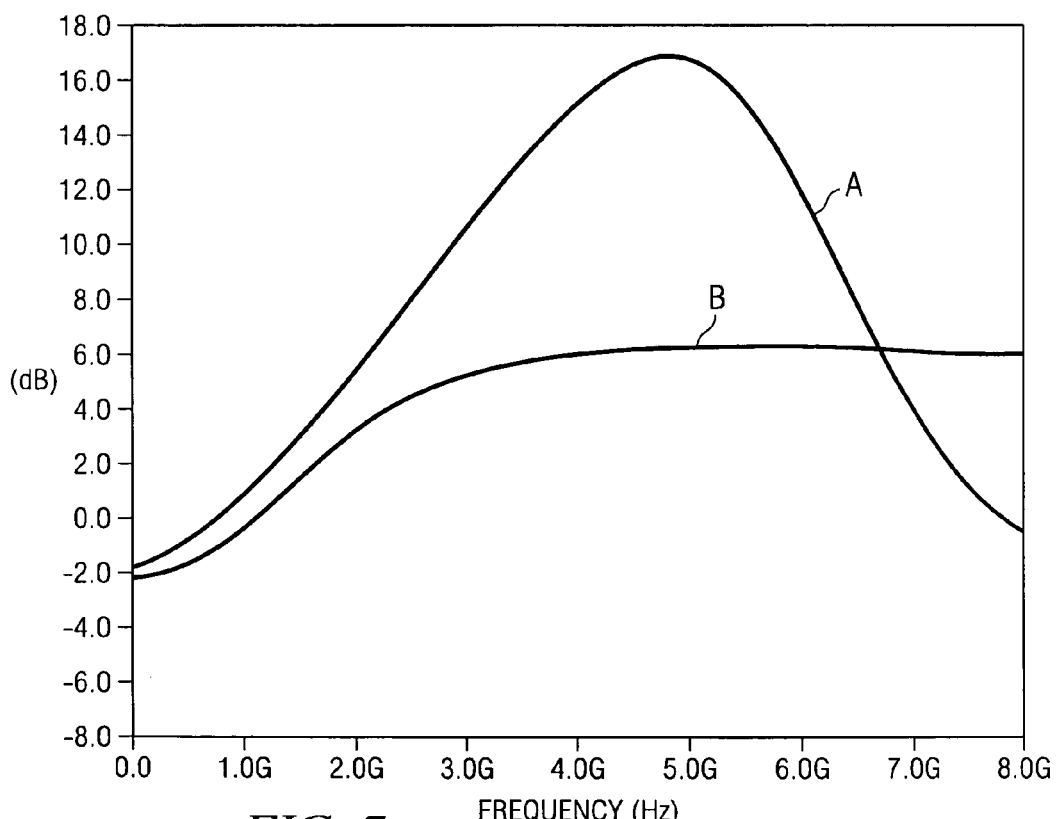
FIG. 7 is a graph with plots of the transfer function of a receiver equalizer with and without a negative impedance according to the FIG. 2 embodiment of the present invention.

With reference to FIG. 7, graphs of the equalizer transfer function with a negative impedance cell 11 (plot A) and without a negative impedance cell 11 (plot B) can be seen.

The amplification at high frequencies achieved by the use of a negative impedance cell in the receiver equalizer can be clearly seen.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A receiver equalizer comprising, a first equalizer unit having a basic equalizer state; and
   a negative impedance cell connected to said basic equalizer stage; wherein the negative impedance cell comprises a pair of back to back transistors, and connected thereto a parallel resistor capacitor RC network, and wherein the basic equalizer stage comprises:
   a pair of current sources;
   a pair of transistors arranged as a differential pair, each transistor connected to a different one of the current sources; and
   a degeneration impedance connected in between the two current sources, and the transistors,
   wherein the negative impedance cell is connected across the outputs of the pair of transistors.

2. A receiver equalizer according to claim 1 wherein the degeneration impedance comprises two capacitors, one connected in parallel to each current source.

3. A receiver equalizer according to claim 1 wherein the degeneration impedance comprises a parallel resistance capacitance RC network connected between the two current sources.

4. A receiver equalizer according to claim 1 wherein the negative impedance cell comprises a pair of back to back transistors, and connected thereto, a parallel resistor capacitor RC network.

5. A receiver equalizer according to claim 4 further comprising a second equalizer stage, wherein said first equalizer unit is cascaded from said second equalizer stage.

6. A receiver equalizer according to claim 5 wherein the second equalizer stage and the first equalizer stage are identical.

7. A receiver equalizer according to claim 4 further comprising a second equalizer unit cascaded from said first equalizer unit, said second equalizer unit comprising a further equalizer stage and a negative impedance cell connected thereto.

8. A receiver equalizer according to claim 7 wherein the first equalizer unit and the second equalizer unit are identical.

* * * * *